United States Patent
Sherman et al.

(10) Patent No.: US 10,971,368 B2
(45) Date of Patent: Apr. 6, 2021

(54) TECHNIQUES FOR PROCESSING SUBSTRATES USING DIRECTIONAL REACTIVE ION ETCHING

(71) Applicant: Varian Semiconductor Equipment Associates, Inc., Gloucester, MA (US)

(72) Inventors: Steven R. Sherman, Newton, MA (US); Simon Ruffell, South Hamilton, MA (US); John Hautala, Beverly, MA (US); Adam Brand, Palo Alto, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 296 days.

(21) Appl. No.: 15/903,412

(22) Filed: Feb. 23, 2018

(65) Prior Publication Data
US 2018/0182637 A1    Jun. 28, 2018

Related U.S. Application Data

(63) Continuation of application No. 14/230,649, filed on Mar. 31, 2014, now Pat. No. 9,934,981, which is a
(Continued)

(51) Int. Cl.
*H01L 21/3065* (2006.01)
*H01J 37/32* (2006.01)
*H01L 29/66* (2006.01)

(52) U.S. Cl.
CPC .... *H01L 21/3065* (2013.01); *H01J 37/32357* (2013.01); *H01J 37/32422* (2013.01); *H01L 29/66803* (2013.01)

(58) Field of Classification Search
None
See application file for complete search history.

(56) References Cited

U.S. PATENT DOCUMENTS

| 4,680,085 A | 7/1987 | Vijan et al. |
| 6,787,052 B1 | 9/2004 | Vaganov |

(Continued)

FOREIGN PATENT DOCUMENTS

| JP | 2006054317 A | 2/2006 |
| JP | 09120954 A | 4/2014 |

(Continued)

OTHER PUBLICATIONS

Jin-Kwan Lee et al. Oblique-Directional Plasma Etching of Si Using a Faraday Cage, Journal of the Electrochemical Society, 2009, D222-D225, 156 (7), The Electrochemical Society.
(Continued)

*Primary Examiner* — John J Brayton
(74) *Attorney, Agent, or Firm* — Kacvinsky Daisak Bluni PLLC

(57) ABSTRACT

A method of treating a substrate includes directing ions to the substrate along at least one non-zero angle with respect to a perpendicular to a substrate surface in a presence of a reactive ambient containing a reactive species where the substrate includes a surface feature. At least one surface of the surface feature is etched using the ions in combination with the reactive ambient at a first etch rate that is greater than a second etch rate when the ions are directed to the substrate without the reactive ambient and greater than a third etch rate when the reactive ambient is provided to the substrate without the ions.

13 Claims, 7 Drawing Sheets

Related U.S. Application Data continuation of application No. 61/882,926, filed on Sep. 26, 2013, which is a continuation of application No. 61/896,042, filed on Oct. 26, 2013.

(56) References Cited

U.S. PATENT DOCUMENTS

| | | | |
|---|---|---|---|
| 7,767,977 | B1 | 8/2010 | Godet et al. |
| 8,101,510 | B2 | 1/2012 | Godet et al. |
| 8,288,741 | B1 | 10/2012 | Miller et al. |
| 9,255,277 | B2 | 2/2016 | Bakker et al. |
| 9,728,623 | B2 | 8/2017 | Zhang et al. |
| 2004/0197975 | A1* | 10/2004 | Krivokapic ........ H01L 29/66818 438/200 |
| 2006/0166419 | A1 | 7/2006 | Shimoyama et al. |
| 2007/0281493 | A1* | 12/2007 | Fucsko ............ H01L 21/76232 438/739 |
| 2009/0250430 | A1 | 10/2009 | Zhang |
| 2010/0252531 | A1* | 10/2010 | Godet ................ C23C 16/045 216/67 |
| 2011/0021027 | A1* | 1/2011 | Johnson ............ H01L 21/3086 438/694 |
| 2011/0248326 | A1 | 10/2011 | Kanakasabapathy et al. |
| 2014/0080276 | A1 | 3/2014 | Brand et al. |
| 2014/0091394 | A1 | 4/2014 | Li et al. |

FOREIGN PATENT DOCUMENTS

| | | | |
|---|---|---|---|
| KR | 1020060078440 | A | 7/2006 |
| KR | 1020150015130 | A | 2/2015 |
| TW | 506006 | B | 10/2002 |
| WO | 20000589853 | A2 | 10/2000 |
| WO | 2014110379 | A1 | 7/2014 |

OTHER PUBLICATIONS

Xin Sun, et al., Selective Enhancement of SiO2 Rate by Ar-Ion Implantation for Improved Etch Depth Control, Electrochemical and Solid-State Letters, 2007, pp. D89-D91, vol. 10. Issue 9, The Electrochemical Society.

R. Charvel et al., Etch Rate Modification of SiO2 by Ion Damage, Electrochemical and Solid State Letters, 2006, pp. G245-G247, vol. 9, Issue 7, The Electrochemical Society.

James C. North. et al., Tapered Windows in Phosphorus-Doped SiO2 by Ion Implantation, IEEE Transactions on Electron Devices, 1978, pp. 809-812, vol. ED-25, IEEE.

Avishai Ofan, et al., Origin of Highly Spatially Selective Etching in Deeply Implanted Complex Oxides, Applied Physics Letters, 2008, pp. 181906-1 to 181906-3, vol. 93, On-line publishing.

* cited by examiner

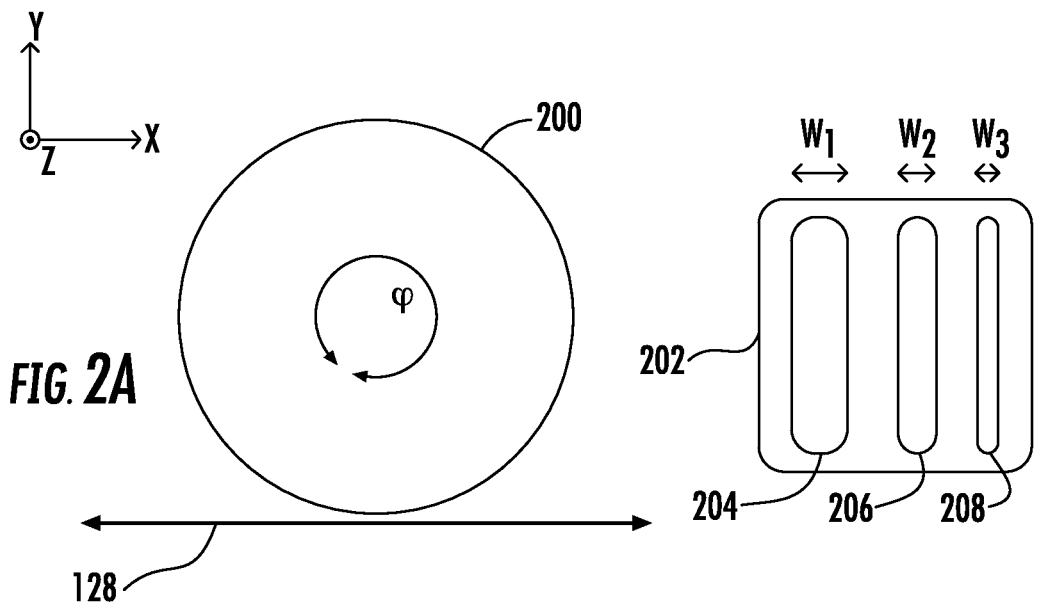
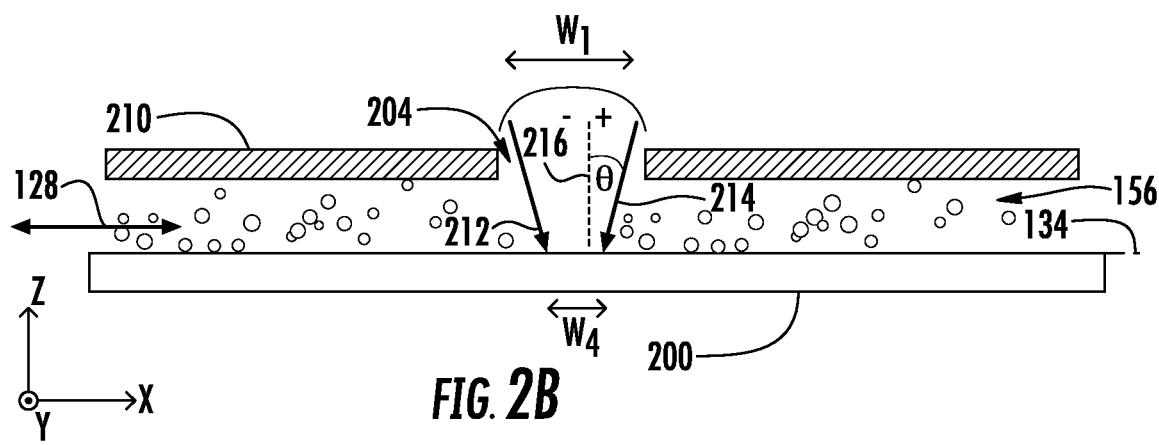
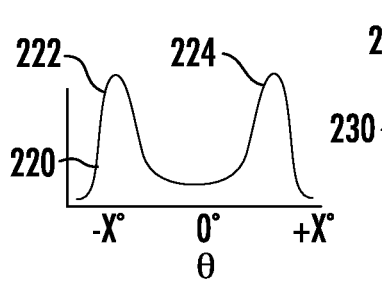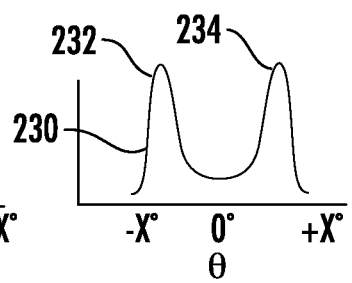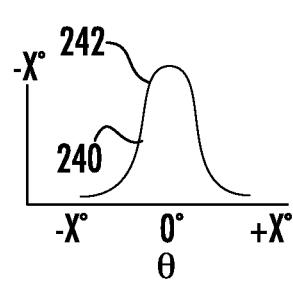
FIG. 2C          FIG. 2D          FIG. 2E

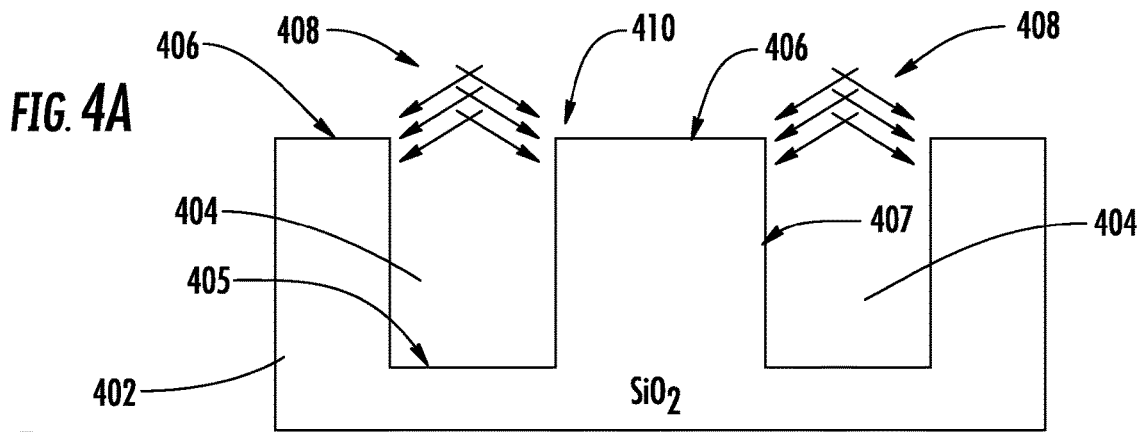
FIG. 4A
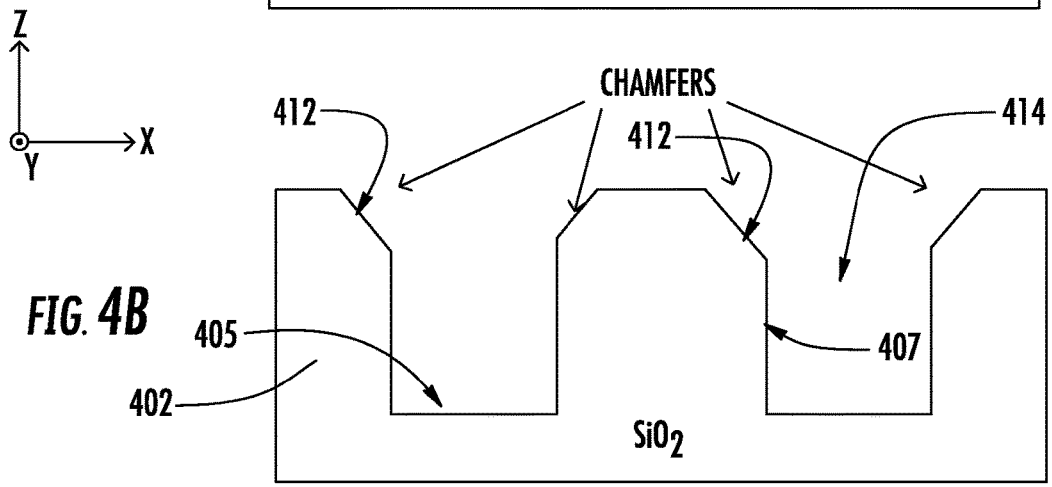
FIG. 4B
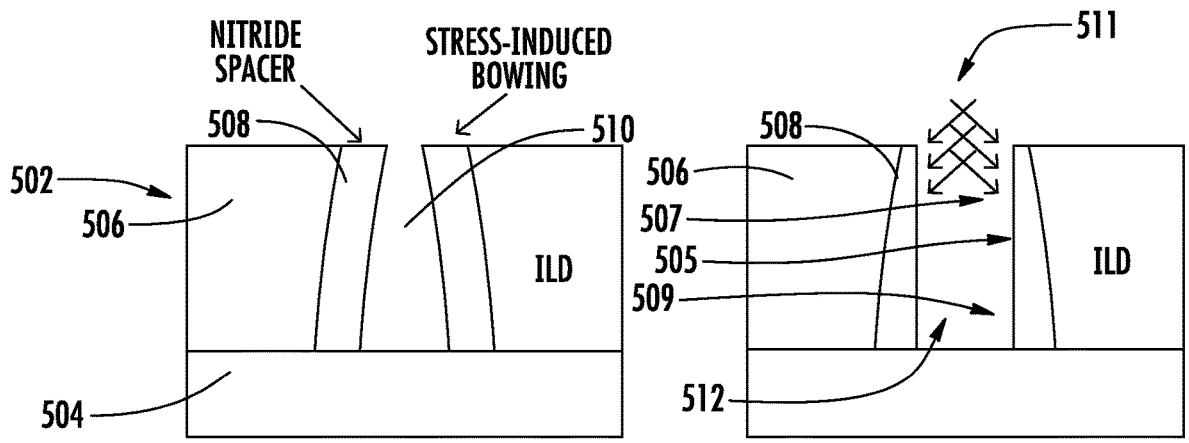
FIG. 5A                    FIG. 5B

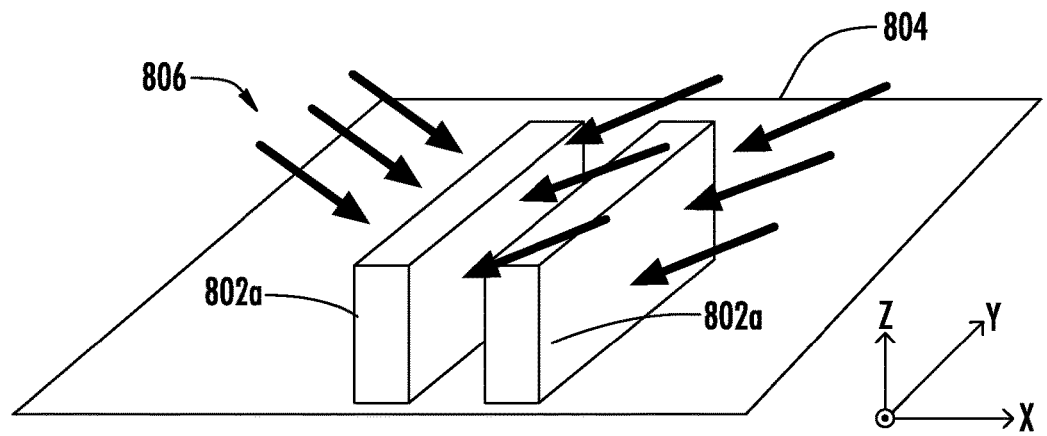
FIG. 8A
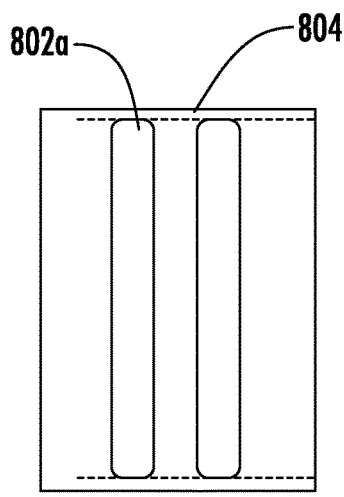   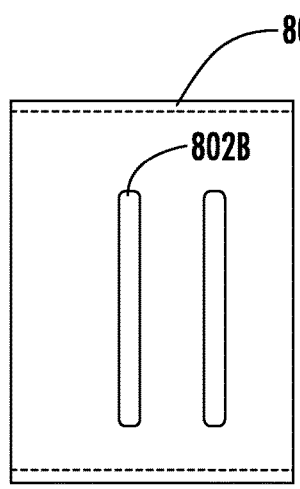   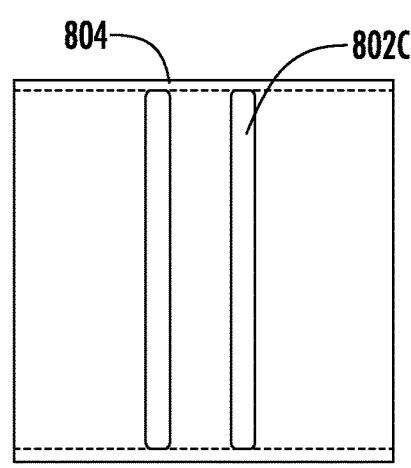
FIG. 8B      FIG. 8C      FIG. 8D
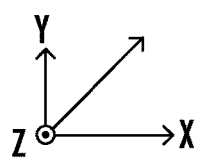

TECHNIQUES FOR PROCESSING SUBSTRATES USING DIRECTIONAL REACTIVE ION ETCHING

This application is a Continuation of, and claims the benefit of priority to, U.S. patent application Ser. No. 14/230,649, filed Mar. 31, 2014, entitled "Techniques for Processing Substrates Using Directional Reactive Ion Etching," which application claims priority to U.S. Provisional patent application No. 61/882,926, filed Sep. 26, 2013 and to U.S. Provisional patent application No. 61/1896,042, filed Oct. 26, 2013, each of which applications are incorporated herein by reference in their entirety.

FIELD

The present embodiments relate to fabrication of patterned substrates and more particularly to the use of ions to etch features in a substrate.

BACKGROUND

In present day electronic devices, fabrication of device structures entails patterning of small features that may have critical dimensions as small as a few nanometers and many have shapes with challenging aspect ratios that are closely spaced, presenting many challenges for processing. In addition during fabrication, including at the final stages, the device structures may include multiple different materials whose etch characteristics are different.

One technique that has been developed and deployed for multiple processing procedures during device fabrication is reactive ion etching (RIE). The RIE process entails exposing a substrate to a reactive plasma that may include gases that generate species, such as fluorine, carbon, hydrogen, and molecules and radicals of the combination of these elements. One chemical system commonly used in the industry for RIE processing is $CH_3F$ mixed with $O_2$. The use of this chemical system in RIE processing leads to two competing mechanisms that take place on the surfaces of all materials on a substrate subjected to the RIE plasma. The first mechanism is etching of the surfaces of the substrate, while the second mechanism is deposition of a carbon-based polymer on substrate surfaces. It may be desirable under process conditions for polymer deposition to be the dominant mechanism at the substrate surface when not subject to ion bombardment. However energetic ion bombardment by species extracted from the RIE plasma can break apart the polymer and produce dangling bonds at the material surface that cause etching of the surface to become the dominant mechanism.

One hallmark of RIE is that under select conditions etching of the substrate surface is strongly material dependent. For example, the exact chemical constituents and their relative ratios may be chosen together with a select range of ion energy by species such that etching becomes the dominant mechanism on the surface of the material type desired to be etched (for example SiN), but polymer deposition remains the dominant mechanism on other material surfaces (for example, silicon). In this way material selectivity for etch rate induced by RIE processing is achieved. In conventional RIE apparatus processing conditions are such that all ion trajectories are normal to the wafer surface, so that horizontal surfaces are subject to ion bombardment to the exclusion of other surfaces such as vertical surfaces. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method of treating a substrate includes directing ions to the substrate along at least one non-zero angle with respect to a perpendicular to a substrate surface, in the presence of a reactive ambient containing a reactive species, the substrate including a surface feature; and etching, using the ions in combination with the reactive ambient, at least one surface of the surface feature at a first etch rate that is greater than a second etch rate when the ions are directed to the substrate without the reactive ambient and greater than a third etch rate when the reactive ambient is provided to the substrate without the ions.

In another embodiment a method of forming a three dimensional (3-D) device, includes: providing a structure on a substrate surface extending perpendicularly to the substrate surface, the structure comprising a first material and a second material; directing ions to the substrate along at least one non-zero angle with respect to a perpendicular to the substrate surface, in the presence of a reactive ambient containing a reactive species; and etching, using the ions in combination with the reactive ambient, at least one portion of the structure at a first etch rate that is greater than a second etch rate when the ions are directed to the substrate without the reactive ambient and greater than a third etch rate when the reactive ambient is provided to the substrate without the ions.

In another embodiment, a method of treating a substrate includes providing a reactive gas ambient in contact with a side of the substrate, the outer surface of the side of the substrate comprising a first material defining a first outer surface in first regions, and a second material disposed under the first material in the first regions, the second material defining a second outer surface in second regions of the side of the substrate; directing a first dose of ions to the substrate in the presence of the reactive gas ambient at least one incidence angle, each incidence angle forming a non-zero angle with respect to a perpendicular to the side of the substrate, the ions configured to etch angled features into the second material along a direction parallel to the at least one incidence angle of the ions at a first etch rate and etch the first material at a second etch rate less than the first etch rate.

BRIEF DESCRIPTION OF THE DRAWINGS

FIG. 2A depicts a top view showing further details of geometry for processing a substrate consistent with an embodiment;

FIG. 2B presents a side view of an exemplary extraction plate containing a single extraction aperture that generates ions that form an angle of incidence with respect to a perpendicular to a substrate plane;

FIGS. 2C to 2E present exemplary distributions associated with angles of incidence for ions produced under different experimental conditions consistent with the present embodiments;

FIGS. 4A and 4B depict an example consistent with further embodiments, in which directional etch selectivity is used to provide a desired shape to a portion of a trench or via region;

FIGS. 5A and 5B provide another example of using directional RIE processing for tailoring trench or via structures;

FIGS. 8A to 8D illustrate an embodiment in which a directionally selective RIE process is used to selectively reduce the dimensions of a patterned feature along one direction.

DETAILED DESCRIPTION

Figure 1A:
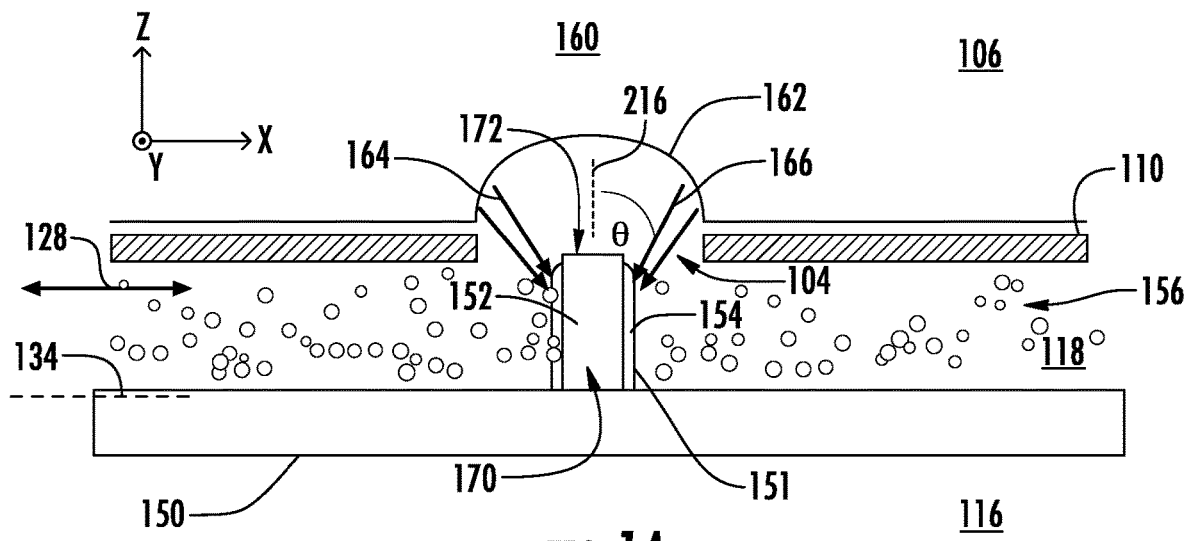
FIGS. 1A and 1B depict a respective side view and top view of processing a substrate in an embodiment of directional reactive ion etching.

The present embodiments are related to reactive etching of substrates and entail the use of ions directed to substrates at non-zero angles with respect to a perpendicular to the substrate surface to achieve directional reactive etching of substrates including patterned features on a substrate surface.

In various embodiments disclosed herein substrates are processed using ions extracted from an apparatus including a plasma source. A plasma source consistent with the present embodiments may include a plasma chamber in which ions are generated for providing to the substrate. The substrates may be disposed in a "process" chamber that is separate from a plasma chamber used to generate ions that are provided to the substrate. An aperture plate may be provided to extract ions from the plasma chamber and direct them to the substrate. Details of such apparatus are known and further discussion is omitted herein.

In the present embodiments, species may be provided to a plasma chamber that are configured to generate a reactive environment at the substrate in which reactive ion etching takes place. Various ions, in particular, are generated in the plasma chamber and extracted through an aperture as an ion beam that impinges upon the substrate in a process chamber adjacent the plasma chamber. Consistent with the present embodiments, the extraction of the ions through the aperture facilitates control of ion beam properties including the size and shape of the ion beam, particularly the ion beam cross-section that impacts the substrate, as well as the angle(s) of incidence of ions that impact the substrate. When used in conjunction with species designed to promote reactive ion etching, this configuration enables a novel "directional reactive ion etching" process in which reactive ion etching can be restricted to desired surfaces on a substrate without affecting other surfaces.

As noted previously, the present embodiments are related to processing substrates in a reactive environment in which reactive species are provided to the substrate. The present embodiments extend to the use of a broad array of gas mixtures used for conventional RIE processing. Thus, in addition to providing ions to a substrate at a chosen angle(s) of incidence, the substrate is simultaneously exposed to reactive species that together with the incident ions generate reactive etching of the substrate. Thus the present embodiments include many of the beneficial attributes of conventional RIE such as a broad array of available chemistries from which to select to provide "material selectivity" during etching. The term "material selectivity" as used herein refers to the etching of a first material substantially faster than a second material. However, the present embodiments provide an additional capability not found in conventional RIE processing or other conventional techniques; the ability to enhance etch rates of select non-horizontal surfaces compared to other non-horizontal surfaces or compared to horizontal surfaces. Examples of this capability, and more particularly, the combination of it with material selectivity are detailed with respect to the FIGs. to follow.

In brief, the term "directional selectivity" as used herein, refers to the quality of enhancing etch rate of non-horizontal surfaces facing a specific direction or set of directions as opposed to surfaces facing other directions, including horizontal surfaces. The term "directional reactive ion etching" (directional RIE) as used herein, refers to the processes consistent with the present embodiments that may provide a combination of providing a reactive ambient to a substrate together with ions that are oriented along specific angles of incidence which may be non-perpendicular to the plane of the substrate being processed. Thus, directional RIE may supply a combination of both material etch selectivity and directional etch selectivity during processing.

An additional feature of the present embodiments, unlike conventional RIE, is that the substrate being processed is not immersed in a plasma, but rather the distance of the substrate relative to a plasma source may be varied. This allows control of various features including allowing the gas pressure at the substrate surface to be controlled independently of the gas pressure within the plasma chamber. Because of this decoupling of plasma chamber and substrate chamber, substrate processing may take place over a continuum from an isotropic highly chemically-driven etch process to an ion beam assisted chemical etch process to a physical (sputter) etch process as the substrate is moved away from the plasma chamber.

Figure 1B:
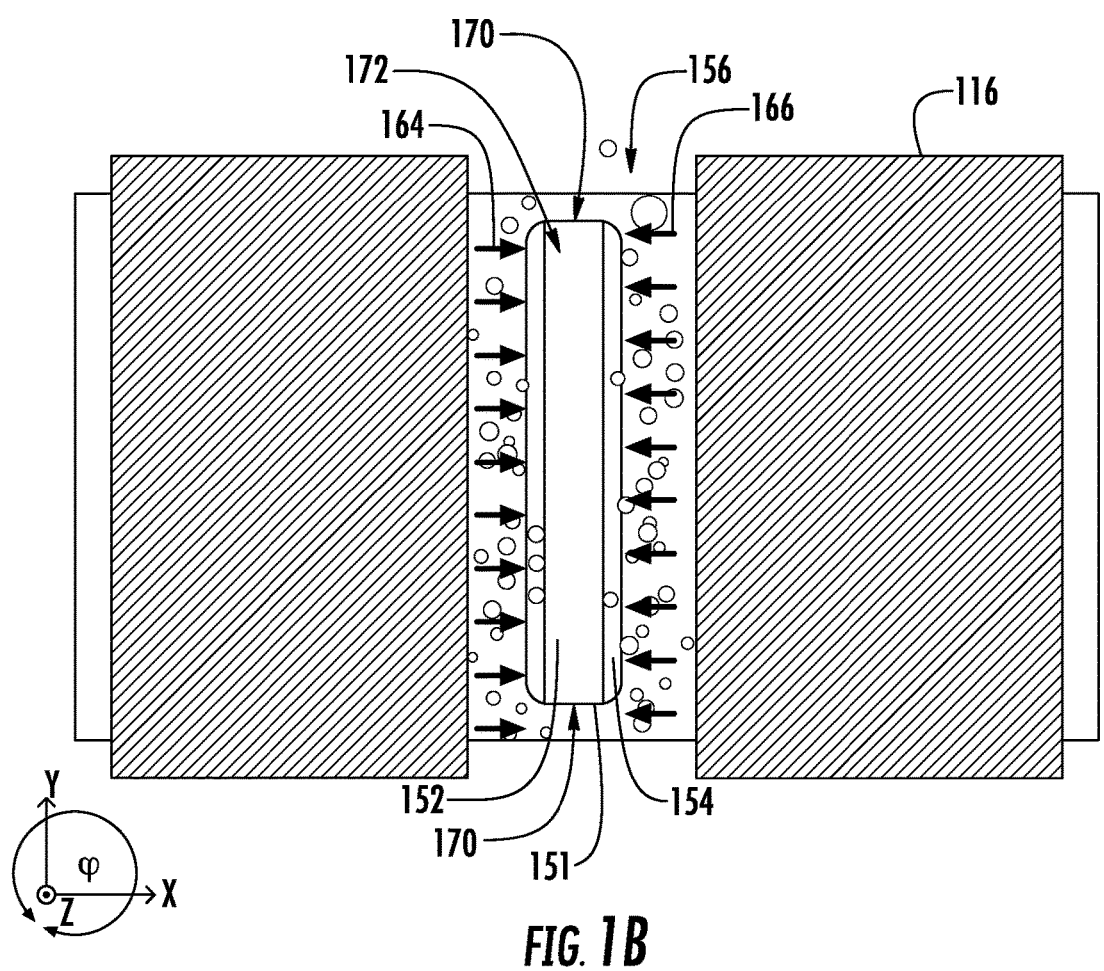

FIGS. 1A and 1B depict a respective side view and top view of processing a substrate 150 in one embodiment of directional reactive ion etching. In this example, an elongated feature, surface feature 151 is disposed on the surface of the substrate 150 and includes core region 152, top surface 172 and sidewalls 154. Notably the FIGS. 1A and 1B are not necessarily drawn to scale. Features on an integrated circuit are often many orders of magnitude smaller than the substrate 150 thickness or the aperture 104 in extraction plate 110. As shown, electrically neutral reactive species 156 are provided in contact with the substrate 150. In various embodiments the reactive species 156 may be provided by flowing gas into the plasma chamber 106 in which plasma 160 is generated. The reactive species 156 then travel into the process chamber 118. The extracted ions from the plasma 160 may also be reactive species.

As shown in FIG. 1A, the positioning of the extraction plate 110 with the aperture 104 may generate a plasma sheath boundary 162 that has a curvature. In the embodiment shown, the plasma sheath boundary 162 has a concave shape with respect to a plane 134 of the substrate 150. This curvature results in the extraction of ions from the plasma 160 at the plasma sheath boundary 162 in which ion trajectories may deviate from a perpendicular incidence with respect to the plane 134. By varying plasma processing conditions of a processing system (not shown), the shape of the plasma sheath boundary 162 may be varied. As detailed below, this may allow control of the directionality or angle of incidence of ions with respect to features on a substrate to be processed.

One particular feature of the present embodiments highlighted by the FIGS. 1A and 1B is that specific ion directions can be provided to ions 164, 166 that are extracted from the plasma chamber 106. These ions can be coupled with the orientation of surface features in a substrate to supply targeted reactive ion etching of desired surfaces of a substrate feature without etching other surfaces. For example, ions can be directed at sidewalls 154 of surface feature 151 while not being directed at "end sidewalls" 170. This type of directional selectivity in a reactive ion etch process enables improved processing of known device structures as well as fabrication of new types of device structures, as detailed below.

FIG. 2A depicts a top view showing further details of geometry for processing a substrate consistent with additional embodiments. In various embodiments, a substrate 200 may be transported along the direction 128, and may be rotated about an axis parallel to the Z-direction, that is, within the X-Y plane. In addition, in different embodiments of extraction plates, the width of an aperture along the scan direction, i.e., along the X-direction, may be tailored in order to change the angle(s) of incidence of ions extracted from a plasma. FIG. 2A depicts examples of different apertures widths $W_1$, $W_2$, and $W_3$ for respective apertures 204, 206, and 208. In various embodiments, the length, L, of apertures 204, 206, and 208 is larger than the diameter of the substrate 200. Each of these different apertures 204, 206, and 208 may generate a different plasma sheath boundary shape and may thereby generate different angles of incidence of ions as detailed below. This is shown in FIG. 2B, which presents a side view of an extraction plate 210 containing aperture 204, which generates ions 212, 214 that form an angle of incidence θ with respect to a perpendicular 216 to plane 134. The plane 134 may define a horizontal surface of a substrate such as the surface of a silicon wafer or other planar substrate.

In the example of FIG. 2A, the three different apertures 204, 206, 208 are embodied in the same extraction plate 202. Accordingly, a single aperture plate may provide different angles of incidence of ions. However, in some embodiments, a single aperture may be provided to each of two or more different aperture plates, in which the aperture width is different within each aperture plate of the two or more different aperture plates. In this manner, control of angle of incidence of ions provided to a substrate for directional reactive ion etching may be controlled by selection of the appropriate aperture plate. In addition to varying aperture size, the shape of a plasma sheath boundary may be affected by plasma conditions including applied power. Accordingly, ion incidence for ions directed to a substrate through an aperture plate may be varied by changing plasma process parameters applied to a plasma chamber in some embodiments.

FIGS. 2C to 2E present exemplary distributions that represent the distribution of angles of incidence θ for ions produced under different experimental conditions consistent with the present embodiments, where θ is the angle as defined in FIG. 2B. In one example, the distributions 220, 230, 240 shown in respective FIGS. 2C, 2D, and 2E, are generated by engineering the extraction aperture plate. The distribution 220 has a bimodal distribution of angles of incidence centered about zero degrees, in which two peaks, peak 222 and peak 224, are located on opposite sides of zero degrees. The assignment of negative degrees for angles of incidence to ions of given trajectories may be chosen as convenient. As shown in FIG. 2B, the negative angles may represent angles of incidence in which the ion trajectories proceed to the right while positive angles may represent angles of incidence in which the ion trajectories proceed to the left. To achieve this type of angle distribution the simple aperture may be modified to include different components.

As illustrated in the distribution 220, few or no ions have trajectories that are perpendicular to a substrate plane (zero degrees), while many more ions have trajectories at angles well displaced from perpendicular on either side of zero degrees. In one example the peaks 222, 224 may form angles of +/−40 degrees with respect to perpendicular. This type of ion distribution may be employed in circumstances in which it is desirable to create less ion impact on surfaces in substrate features that lie parallel to the plane 134 and are shadowed from the ions, and more desirable to impact surfaces that are disposed at an angle with respect to the plane 134. Examples of such features include trenches with height greater than width in which the sidewalls of the trenches are to be processed or etched, but the bottoms of the trenches are to remain unprocessed or etched.

The distribution 230 of FIG. 2D is qualitatively similar to the distribution 220 of FIG. 2C except that the peaks 232, 234 are less separated from one another. For example, the peaks 232, 234 may form angles of +/−20 degrees with respect to perpendicular. In further examples the peaks 222, 224 may form angles of up to +/−60 degrees with respect to perpendicular.

The distribution 240 is a monomodal distribution in which a single peak 242 is centered about zero degrees. This type of ion distribution may be employed in circumstances in which it is desirable to create more ion impact on surfaces in substrate features that lie parallel to the plane 134 and less desirable to impact surfaces that are disposed at an angle with respect to the plane 134.

Figure 3A:
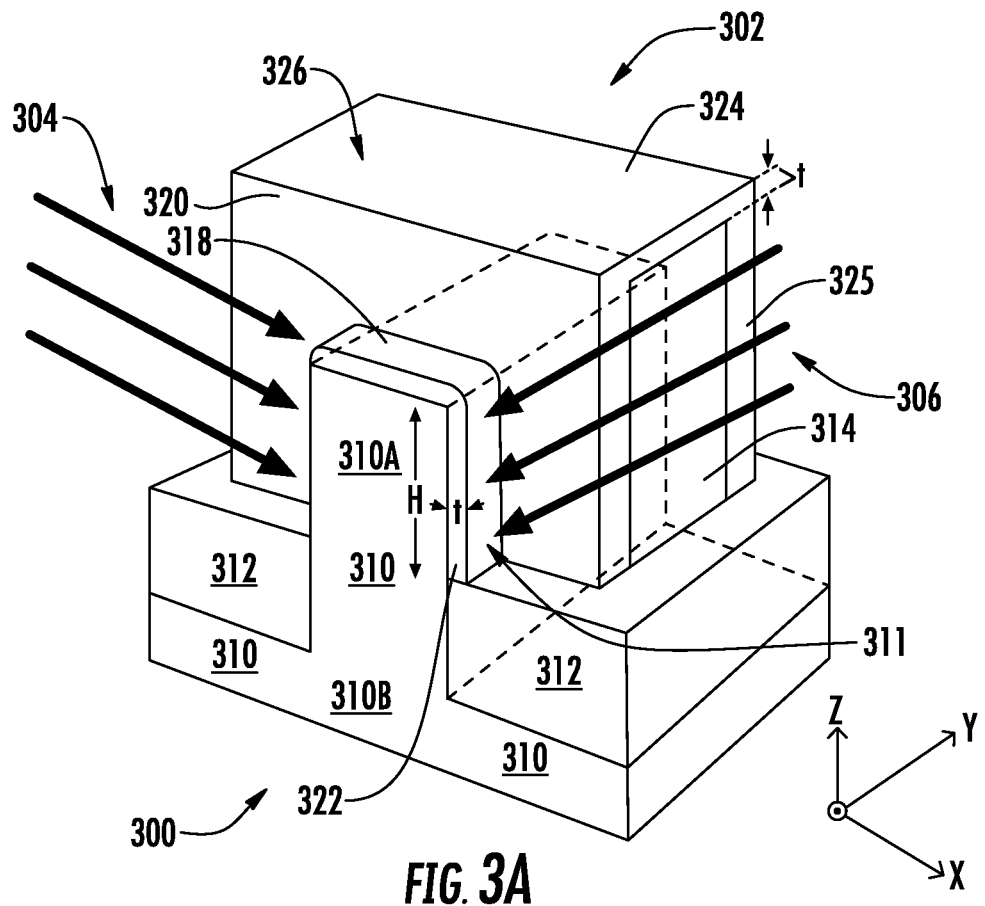
FIGS. 3A and 3B depict an example of a structure that may be found in present day semiconductor devices such as transistors for use in logic, memory, or other devices.
Figure 3B:
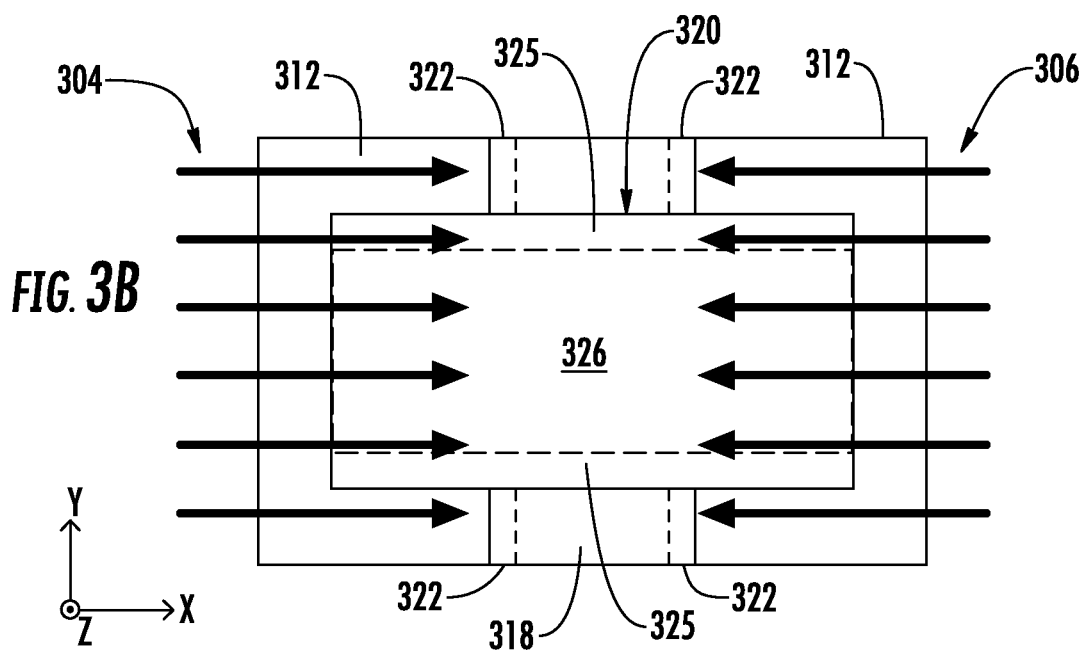

In the FIGs. to follow, specific examples of structures that may be processed according to directional RIE processing of the present embodiments are set forth to illustrate principles and advantages afforded by the present embodiments. In FIGS. 3A and 3B there is shown an example of a structure that may be found in present day semiconductor devices such as transistors for use in logic, memory, or other devices. The device structure 300 may be used to form a three dimensional transistor, such as a fin type field effect transistor (finFET). By way of background, present day transistors are formed using spacer films, such as a silicon nitride (SiN), silicon carbon nitride (SiCN), silicon oxynitride (SiON), or silicon carbon oxynitride (SiCON) to protect gate sidewalls and offset source/drain regions from transistor channel regions. Etching of such spacer films on planar transistors may be accomplished using conventional reactive ion etching (RIE). However, etching of a spacer film on three dimensional device such as a finFET presents a great challenge. As detailed below, it is desirable to etch a spacer that is formed on the semiconductor "fin" portion of the device without etching it from the sidewalls on the gate structure.

In the example illustrated in FIGS. 3A, 3B, the finFET structure is shown part way through fabrication of a finFET where a semiconductor portion 310 of the device structure 300 has been etched to form a fin portion 310A, which extends vertically along the Z-direction from a base portion 310B and also extends along the Y-direction. The fin portion 310A is covered by a gate portion 314 that wraps around three sides of the fin portion 310A. The gate portion 302 is isolated from the based portion by an insulator 312, which may be an oxide in some examples. A spacer film 324 is shown deposited on both the gate portion 314 and the fin portion 310A. The gate portion 314 may be a polycrystalline material such as polysilicon in some embodiments. The spacer film 324 may be an insulator such as a nitride that has different etch properties than the gate portion 314, the semiconductor portion 310, and/or the insulator 312.

As illustrated in FIG. 3A, 3B ions 304, 306 are directed toward the device structure 300. The ions 304, 306 may be directed from a processing system in which the ion trajectories are distributed over a bimodal distribution of angles of incidence, as illustrated, for example, in FIGS. 2C, 2D. In addition, the ions 304, 306 are directed such that their trajectories are parallel to the edge 320 of the gate portion 314. As detailed below, this distribution of ion trajectories has the advantage that the ions 304, 306 may be directed at a non-zero angle to a first set of sidewalls of the device structure 300 that have a first set of edges oriented along a first direction, while at the same time the ions 304, 306 do not impact a second set of sidewalls that have a second set of edges oriented along a second direction different from the first direction.

Turning in particular to FIG. 3A, a fin structure 311 is shown which includes a semiconductor core, that is, fin portion 310A, and a coating disposed around the semiconductor core, that is, the sidewall portions 322. In the present embodiments, the ions 304 and reactive gas ambient (not separately shown) are configured to etch the coating, sidewall portions 322, at a first etch rate, and configured to etch the core, fin portion 310A, at a second etch rate that is less than the first etch rate.

This scenario provides the advantage that ions are directed to selectively target the sidewall portions 322 of the fin structures 311 for etching while leaving other structures intact. The sidewall portions 322 are formed as part of the material of the spacer film 324 in this embodiment. Given the convention that the X-Y plane represents the substrate surface for the device structure 300 and the Z-axis represents the perpendicular to the substrate surface, the ions 304, 306 may be targeted an angle with respect to the perpendicular of ten to sixty degrees in some embodiments.

The ions 304, 306 may be provided as part of a reactive ion etching gas composition that will selectively etch an insulator material at a higher rate than a semiconductor material. In some examples precursor gas compositions are employed and delivered to a processing system to generate the ions 304, 306 as well as other reactive species (not shown) that are effective to selectively etch nitride material at a higher rate than oxide material and silicon. Such precursor gas compositions are well known and will not be detailed herein. The ions may be provided at an ion energy that is sufficiently low that sputter etch rate from physical sputtering of surfaces impacted by the ions is much less than reactive ion etch rate due to the interaction of ions with the reactive species to volatilize surface material, such as nitride. For example, the ion energy of ions 304 may be less than 400 eV in various embodiments.

If the ions 304, 306 are directed at an angle near 45 degrees with respect to the perpendicular (Z-axis) to the substrate surface, the ion flux per area on the sidewall portions 322, which runs parallel to the Y-direction, is comparable to that on the gate insulator top portion 326 and fin insulator top portion 318. In addition, the entire height H of the sidewall portions 322 may receive exposure to ions 304, 306 so that removal of the spacer film on the sidewall portions 322, which takes place by etching perpendicular to the Y-direction, merely requires removal of t thickness of material from the sidewall regions. In this manner, given that the thickness of the gate insulator top portion is equal to or greater than the thickness t of the sidewalls, although some or all of the spacer material on the gate insulator top portion 326 may be removed, the sidewalls 325, which are formed from the spacer film 324, of the gate portion 302, will remain intact as is desired for finFET fabrication.

The reactive species provided to the device structure 300, in concert with the ions 304, 306 may provide an etch selectivity of spacer material to the underlying semiconductor material of semiconductor portion 310 of 20:1 or greater. In this manner, the processing depicted in FIGS. 3A and 3B may successfully remove the spacer from around the fin portion 310A, namely sidewall portions 322 and fin insulator top portion 318, without removing excessive amounts of semiconductor material in the fin portion 310A.

In contrast, in conventional RIE processing used to etch the spacer of a fin, ions impinge perpendicularly to a substrate surface, which is along the Z-direction in the example of FIGS. 3A, 3B. This results in etching from the top down along the Z-direction of features exposed to etching ions. In order to remove the desired sidewall portions 322 of the fin portion 310A, the sidewall portions 322 are etched by the ions that are directed vertically (along the Z-axis) through the entire height H of the fin portion that is above the insulator 312. This etching removes the fin insulator top portion 318 and exposes the top of the fin portion 310A early in the etch process. Therefore, the fin insulator top portion 318 is exposed to ions directed along the Z-direction for much longer compared to the etch process of the present embodiments. This leads to excessive damage and etching of the semiconductor material of the fin portion 310A.

This vertical etching produced by conventional RIE processing also results in removal of the gate insulator top portion 326 and vertical etching of the spacer on the sidewalls 325 of the gate portion 302, which removes a top portion of the sidewalls 325 equivalent to the height H. In subsequent processing of finFETs using the replacement gate technology, the gate is removed, leaving the sidewalls 325 to form the "container" for the permanent gate to be formed. However, because the sidewalls 325 are recessed up to the height H from their original height, the original height of the gate portion 302 is made taller in conventional processing than the final required gate height in order to compensate for the recess. This increases cost and decreases the capability to pattern the gates.

FIGS. 4A and 4B depict an example consistent with further embodiments, in which directional etch selectivity is used to provide a desired shape to a portion of a trench or via region. In this example an insulator layer 402, such as an oxide may be etched form the trenches 404, which have an top surface 406 and lower surface 405 and sidewall 407. In the present embodiments, however, these trenches may be formed in any material. In many situations of device processing subsequent process steps involve coating a trench or via with a different material in a conformal manner. In order to deposit a subsequent conformal layer into the surfaces of the insulator layer including the trenches 404, it may be desirable to "round off" or chamfer the top regions 410 at the top of the trenches 404. In conventional RIE processing, ions are directed along the Z-direction as noted previously. Thus, reactive ion etching processes are concentrated upon top surface 406 in conventional RIE processing. Therefore rounding or chamfering of such trenches may be difficult to accomplish using conventional RIE processing. However in conventional RIE practice the top corner of a trench may be observed to be rounded or chamfered, possibly because local electric fields are curved and not parallel to the wafer surface at the top corners of the trench, which guide energetic ions to the corners.

Although rounding or chamfering of such top regions 410 may be observed as a byproduct of conventional RIE processing where the ions are directed along the Z-direction, the top surface 406 is etched faster than the etching rate to form chamfer regions. This results in an undesirable reduction of trench height in order to prepare the trench for subsequent conformal deposition. To compensate or this, a deeper trench than otherwise needed can be fabricated. This adds cost and reduces capability for fabricating given structures.

In contrast, as illustrated in FIG. 4A, in some embodiments ions 408 are provided at a bimodal distribution of angles of incidence, which may range between 30 and 60 degrees with respect to a perpendicular to the top surface 406 in particular examples. This results in the formation of chamfers 412, as illustrated in FIG. 4B, without excessive loss of material from the top surface 406, forming trenches 414 of a desired shape and size.

FIGS. 5A and 5B provide another example of using directional RIE processing for tailoring trench or via structures. In this example, a device structure 502 includes a base portion 504 upon which a dielectric material 506 is formed. Holes or trenches 510 are patterned into the dielectric material 506 and a liner portion 508 is formed within the trenches 510. The liner portion is etched or chemical-mechanically polished (CMP) from the top surface. Sometimes this results in a reentrant structure, which has an undesirably narrowing profile towards the top regions of the trenches 510. Consistent with various embodiments, ions 511 are directed to the device structure 502 having a bimodal distribution of trajectories as shown in FIG. 5B. This results in ions 511 selectively etching upper portions 507 of a sidewall 505 of the trenches 510, as opposed to lower portions 509 of the sidewall 505 of the trenches 510, resulting in trenches 512 having an improved profile as shown.

As detailed in FIGS. 4A-5B, reactive ion etching can be selectively targeted to top corners of trench features in order to etch such features to provide desired shapes without excessive etching of top surfaces adjacent such trenches. This directional selectivity may also be taken advantage of in circumstances in which the bottoms of trenches and/or the bottom parts of the trench sidewalls are to be protected from ion damage or etching. In general, ions may be completely shadowed from striking the bottom portions of such trenches for trenches having relatively high aspect ratios and ion trajectories forming a large enough angle with respect to a perpendicular to the substrate surface. For example, for ion angles approximately 45 degrees, the bottom of a trench of equal height and width (aspect ratio ~1) will be shadowed and protected from ion bombardment.

FIGS. 6A to 6D depict another example of processing three dimensional device structures consistent with additional embodiments. In the example shown, a three dimensional structure is formed in which a recessed tunnel region is formed that lies parallel to a substrate surface. This type of process is useful for forming device structures such as gate-all-around devices as detailed in the FIGS. 6A to 6D. The device structure illustrated in FIGS. 6A to 6D may have, three or more layers, wherein a top layer comprises a first material having a top surface, a second layer adjacent the top layer comprises a second material, and a third layer adjacent the second layer comprises a material different than the second material. This type of structure is particularly useful for forming etched structures such as gate-all-around structures. When the three or more layers are etched to form a patterned features, the gate-all-around structures may have a pair of opposed sidewalls oriented along a first direction, and a pair of covered portions that are made from a fourth material that is disposed on the opposing sidewalls and top surface of the patterned feature. The fourth material may be used to define an exposed portion of the patterned feature. In order to form the gate all-around structure ions may be directed to at least one sidewall of the pair of opposed sidewalls at the non-zero angle.

Figure 6A:
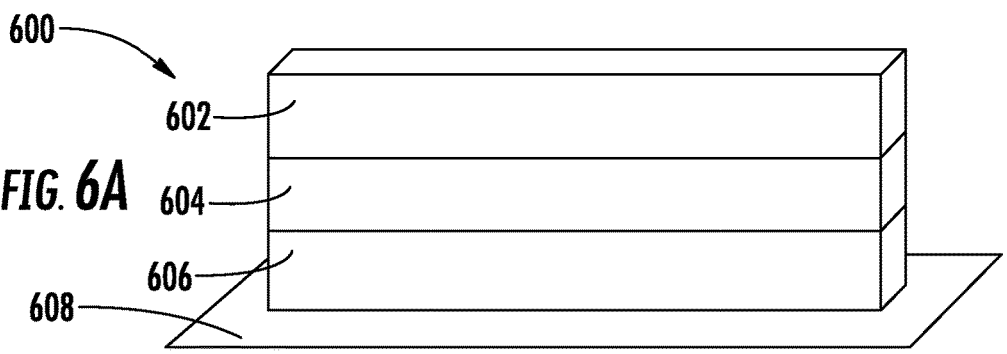
FIGS. 6A to 6D depict another example of processing three dimensional device structures consistent with additional embodiments.

To illustrate this process, in FIG. 6A a fin structure 600 is formed on a substrate or base 608. The fin structure 600 is composed of a top layer 602, which is disposed on a middle layer 604, which is disposed on a bottom layer 606. The middle layer 604 is composed of a material that is different from material used to form the top layer 602 and from material used to form the bottom layer 606. In some examples, the top layer 602 and bottom layer 606 are the same material, such as single crystalline silicon. The middle layer 604 may be a silicon germanium alloy is some instances. The composition of the middle layer 604 differs sufficiently from that of the top layer 602 and bottom layer 606 so as to confer an etch selectivity to the middle layer 604 with respect to the top layer 602 and bottom layer 606 under reactive ion etching. For example, the reactive ion etching ambient may be a known mixture of gaseous species and ions that selectively etches SiGe with respect to Si. In some examples the material etch selectivity of the middle layer 604 may be greater than about 5:1, meaning that the middle layer 604 may etch at least five times faster than the top layer 602 and bottom layer 606 when exposed to the same ions and reactive species at the same concentration and energies.

Figure 6B:
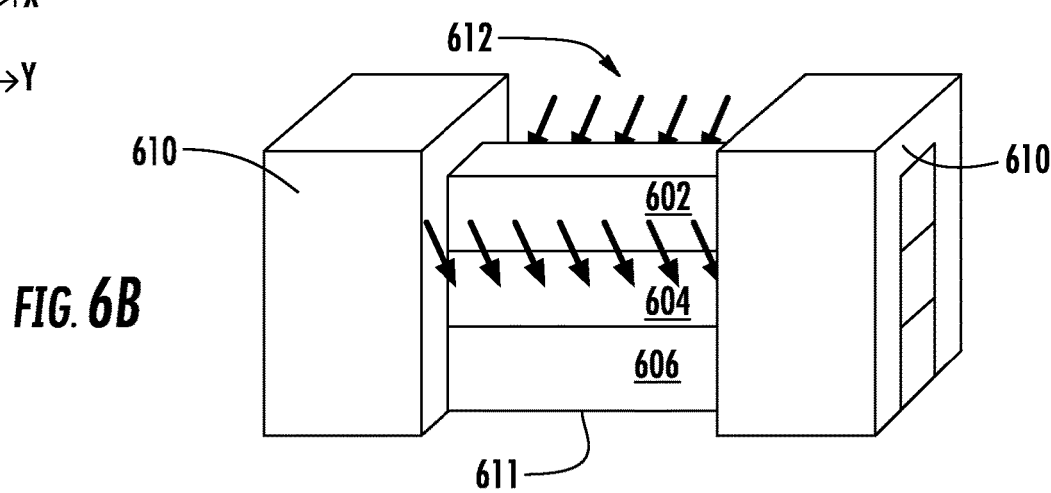

Turning now to FIG. 6B there is shown a subsequent instance in which mask portions 610, such as photoresist, is applied to the fin structure 600 on two opposite ends so as to define an exposed region 611. Ions 612 are directed towards the fin structure 600. As in the embodiment of FIG. 3A, the ions 612 may be directed parallel to the X-direction and may form a bimodal distribution of angles with respect to the Z-direction such as +/−45 degrees to name just one example. In this manner a substantial flux of ions 612 is intercepted by the opposing sides of the fin structure 600 that lie parallel to the Y-direction. Of course ions 612 are also intercepted by the mask portions 610, but may be attenuated by the mask portions 610 without striking the top layer 602 at its opposite ends.

Figure 6C:
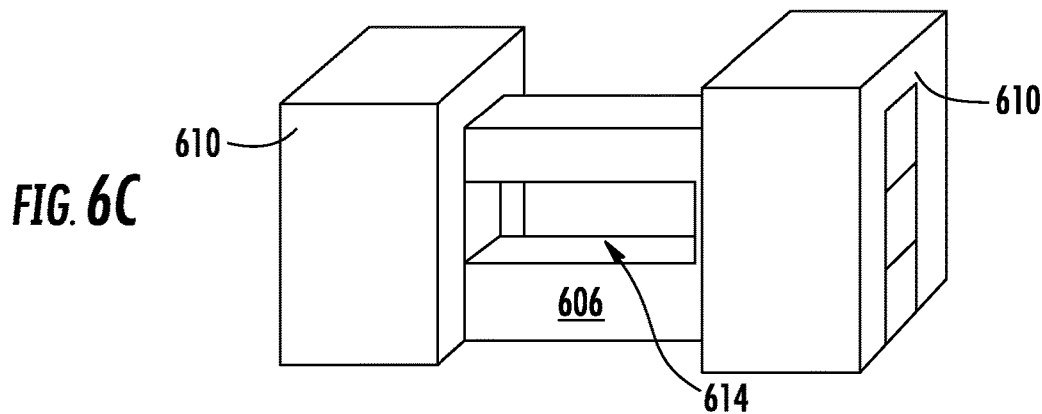
Figure 6D:
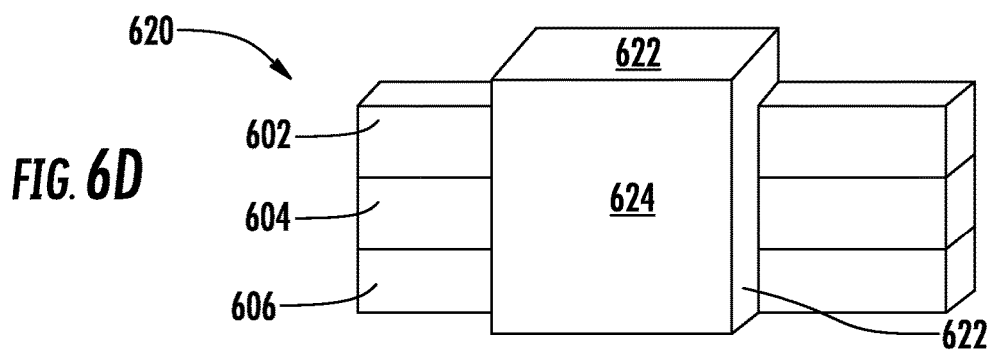

Because the middle layer 604 etches much faster than the top layer 602 and bottom layer 606, the middle layer 604 may be completely removed while leaving the top layer 602 and bottom layer 606 intact. This is shown in FIG. 6C where a tunnel 614 has formed in the middle layer 604. Subsequently, as shown in FIG. 6D a material 622 may be formed as shown in a central region of the fin structure 600. The material 622 may be a semiconductor such as polysilicon that also fills the tunnel 614, forming the filled region 624, resulting in a polysilicon conductor surrounding a portion of the top layer 602. This resultant structure may act as a gate-all-around transistor. The processing outlined in FIGS. 6A-6D cannot be accomplished by conventional RIE where ions are only provided normal to the substrate surface. Although FIG. 6B depicts providing ions in a bimodal distribution of angles that directs ions at two opposed sidewalls of the fin structure 600, in other embodiments, ions may be directed at a single sidewall of a fin structure, which may nevertheless be effective to etch a tunnel in the middle layer 604.

Although the above example involves formation of a transistor device, in other embodiments, RIE etching using directional selectivity may be targeted to etch subsurface holes, tunnels, cantilever structures, and so forth, to form a variety of devices and structures including microelectromechanical (MEMS) devices.

In still further embodiments, reactive ion etching may be directed to form angled features such as angled contact holes or angled trenches. Such angled contact holes or trenches may have high aspect ratios such as those achieved by conventional RIE processing that is used to form trenches or contact vias whose axes are oriented perpendicularly with respect to a substrate surface. Such angled contact hole formation may be useful to arrange contacts or circuitry in a manner not achieved by conventional processing. For example, angled contact hole formation may facilitate the ability to contact buried regions such as buried conductors that lie directly below material that cannot be removed.

In order to fabricate angled vias or trenches using angled reactive ion etching, a first mask material layer is disposed on an underlying layer in which the vias are to be formed. The mask is etched to the top of the underlying layer in patterned regions in which the vias or trenches are to be formed. The outer surface of the substrate is thus defined by a first outer surface that constitutes surface features comprising the mask material in first regions, and by a second outer surface that is defined by the top surface of the underlying layer in second regions, that is, the etched regions. Angled reactive ion etching is subsequently performed in a manner that selectively etches the underlying layer faster than the mask layer in order to form the vias or trenches. This may be useful to form device structures that are not possible to fabricate using conventional patterning and RIE etching that forms vertically oriented vias or trenches.

Figure 7A:
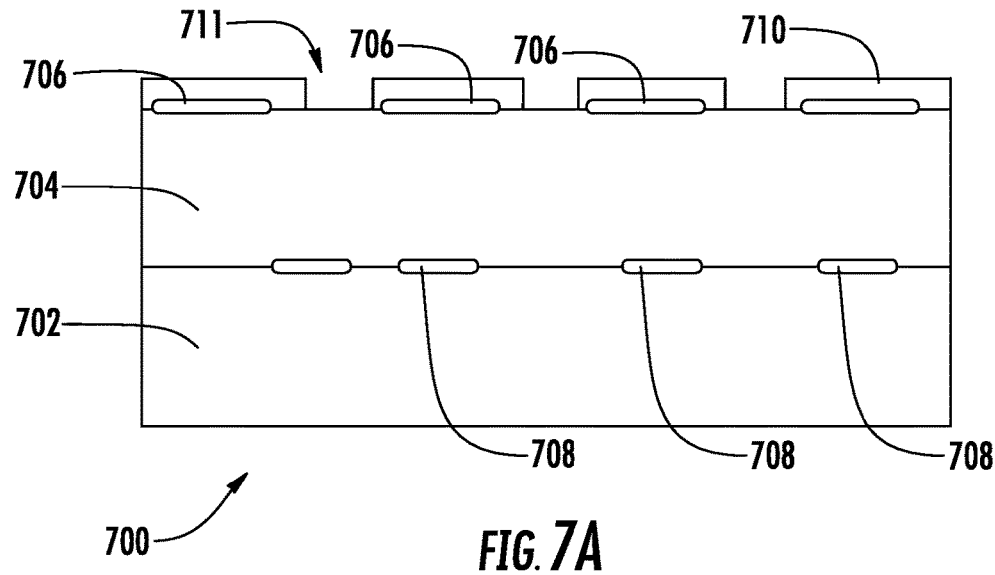
FIG. 7A depicts an example of a substrate structure for processing using angled reactive ion etching.

To illustrate this process, FIG. 7A depicts an example of a substrate structure 700 that includes a base layer 702 and intermediate layer 704. A series of buried features, which may be contacts 708, are defined on the top of base layer 702 and are buried by the intermediate layer 704. Subsequently, it may be desirable to form contact with one or more buried features. A mask layer 710 is formed on the intermediate layer 704, which may be an interlevel dielectric, and a series of surface features such as holes 711 etched into the mask layer 710 to contact the intermediate layer 704, as shown in FIG. 7A.

Figure 7B:
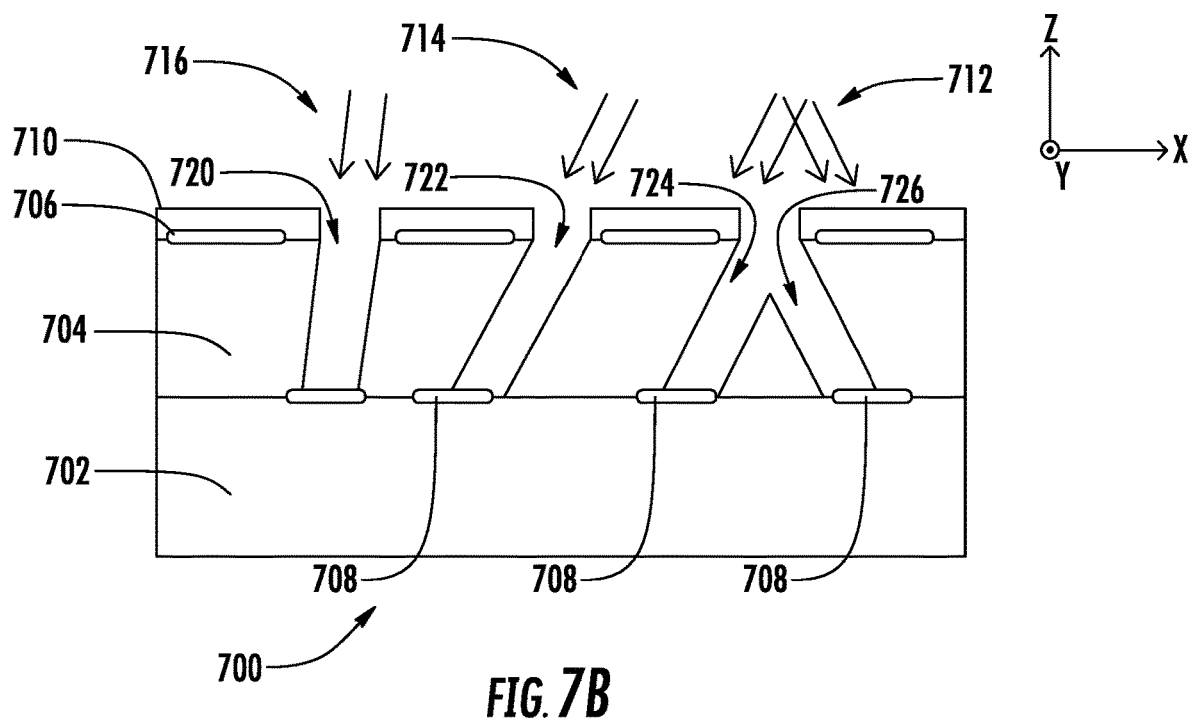
FIG. 7B depicts a reactive ion etching process applied to the substrate of FIG. 7A using ions that are provided at non-perpendicular incidence.

Subsequently, a reactive ion etching process is performed using ions that are provided at non-perpendicular incidence, so as to form a non-zero angle with respect to the Z-direction as shown in FIG. 7B. For the purposes of concision, a series of three different exemplary ion distributions 712, 714, and 716 are illustrated. Reactive ion etching conditions are chosen so as to confer a high degree of materials etch selectivity such that the intermediate layer 704 etches at least 5 times faster than mask layer 710. Accordingly, deep vias or trenches may be etched into the intermediate layer 704 while the mask layer 710 remains intact. Because the ions are provided at an angle with respect to perpendicular, however, the direction of vias and trenches is not vertical (parallel to the Z-direction), but rather is parallel to the direction(s) or incidence angle(s) of the ion distributions 712, 714, or 716. Since reactive ion etching creates volatile etch products that are removed in the gas phase, material removed from the contact vias 720, 722, 724, or 726 during reactive etching is not redeposited, thereby allowing the trenches to be formed with large aspect ratios. As shown in FIG. 7B, the vias 720-726 extend to the top of base layer 702 and land on contacts 708 in the case of contact vias 722, 724, and 726. Subsequently, the contact vias 722, 724, and 726 may be filled with conductive material to form electrical contact with a set of features disposed adjacent a bottom surface of the intermediate layer 704, which are shown as the contacts 708. Some of these contacts 708 lie directly underneath a top feature 706, which masks the respective buried contact from being accessible using a vertical via. Such a top feature 706 may be a conductor or any other feature that is undesirable to be removed. Thus, the ability to form angled vias facilitates contacting buried features in a first layer that are directly underneath features in a second layer, such as at least one contact via. This feature of the present embodiments may facilitate relaxation of circuit design rules by adding a degree of freedom to location of the contact hole patterning.

In additional embodiments, a directional selectivity is provided in a reactive ion etching process to alter the shape of mask features. This may be useful for patterning small features and patterns of features which conventional lithography and etch processes are unable to generate. For example, when defining features significantly smaller than 50 nm, conventional lithography can be used to pattern a relatively large feature, and a subsequent conventional etch can be used to shrink it. In this case, the feature size will be reduced isotropically, i.e. both the length and width of the feature will be reduced. In order to generate some patterns of features, it may be desirable to shrink a feature in one direction only, for example reduce its width but not its length.

In various embodiments, the directional selectivity of etching of a surface feature is such that before the etching, within a first plane that is parallel to the substrate surface feature has a first length in a first direction and a first width in a second direction, while after the etching, within the plane the surface feature has the first length in the first direction and a second width in the second direction less than the first width.

FIGS. 8A to 8D illustrate an embodiment in which a directionally selective RIE process is used to reduce the dimensions of a patterned feature along one direction but not along other directions. In this example the patterned feature in question is two lines that may be used as a mask for pattern transfer to an underlying substrate. FIGS. 8A and 8B show a tilted view and top plan view of two lines, lines 802A, which are formed on a substrate 804 before treatment by directionally selective RIE. The lines 802A may be formed by conventional lithography and etch processing. The lines 802A have a length in the X-Y plane as shown in FIG. 8B. The lines 802A may be made of any material, but in particular may be SiN, SiO$_2$ or photo-resist.

If it is desirable to shrink the size of the feature in one direction, for example in an X-direction, but maintain the feature size in the other direction, for example in a Y-direction, then conventional processing is inadequate. FIG. 8C shows a top plan view of the lines 802B, which represent the altered form of lines 802A after treatment by a conventional etch process. Note these lines 802B are shrunk in both the X and Y directions compared to lines 802A. In embodiments of this disclosure, this problem is overcome by the application of directionally selective RIE. For example, as illustrated in FIG. 8A, ions 806 may be provided by an extraction aperture so that the ions 806 impinge upon the lines 802A with trajectories that are parallel to the X-axis. In this example, the ions 806 may be part of an ion beam that provides a bimodal distribution of angles of incidence as illustrated, for example, at FIGS. 2F and 2G.

FIG. 8D shows a top plan view of the lines 802C, which represents the altered form of line 802A, after treatment by directionally selective RIE. As illustrated, the lines 802C now have the same length but smaller width as the lines 802A because the directionally selective RIE process has removed material that reduces the dimension along the X direction but not the Y direction. Subsequently, in some embodiments the lines 802C may be used to define an lines within the substrate 804 by performing etching along the Z-direction. This subsequent etching may be performed by any convenient etching tool such as a conventional RIE tool. In other embodiments, the lines 802C may be a final feature of the substrate being patterned. In either case, a small feature is formed, such as a feature having dimensions along the X direction of less than 50 nm, where the feature cross-section in the X-Y plane has a shape and is part of a pattern of features that is not achievable by conventional etching/lithography techniques. Lines are chosen here as an example of applying directional RIE to changing the shape or dimensions of an etch mask, but the present disclosure is not to be limited to lines. In general it may be desirable to change the feature size in one direction only of other types of features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed:

1. A method of treating a substrate, comprising:
providing a surface feature in the substrate, wherein the surface feature comprises a first material, disposed as a liner along a second material, the surface feature comprising a first sidewall and a second sidewall opposite the first sidewall and facing the first sidewall, the first sidewall and the second sidewall being separated by a first distance, wherein the first sidewall and the second sidewall define a reentrant profile; and
directing first ions to the first sidewall along at least one non-zero angle with respect to a perpendicular to a substrate plane in a presence of a reactive ambient containing a reactive species,
directing second ions to the second sidewall along at least one non-zero angle with respect to the perpendicular to a substrate plane in the presence of the reactive ambient containing a reactive species,
wherein the first sidewall and the second sidewall are etched by the ions in combination with the reactive ambient, wherein a first portion of the first material is etched, wherein at least a portion of the first material remains as the liner along the first sidewall, after the directing the ions, and
wherein a distance between an upper part of the first sidewall and an upper part of the second sidewall is increased, while a distance between a lower part of the first sidewall and a lower part of the second sidewall is not increased.

2. The method of claim 1, wherein the surface feature defines a trench, including the first sidewall and the second sidewall.

3. The method of claim 2, wherein after the directing the ions, a trench width increases in an upper portion of the trench adjacent an upper surface of the trench.

4. The method of claim 1, wherein the first sidewall and the second sidewall extend along a first direction in a plane of the substrate, and wherein a projection of a trajectory of the ions within the substrate plane extends parallel to a second direction, orthogonal to the first direction, wherein the ions do not impact surfaces extending along the second direction.

5. The method of claim 4, wherein the surface feature comprises a trench, wherein the trench comprises a first shape before the directing the ions, wherein the trench comprises a second shape after the directing the ions, and wherein the second shape is elongated along the second direction with respect to the first shape.

6. The method of claim 1, wherein the ions comprise a bimodal distribution of trajectories, wherein the ions simultaneously impact the first sidewall and the second sidewall.

7. A method of modifying a trench, comprising:
providing the trench in a substrate, the trench including a first sidewall and a second sidewall, opposite the first sidewall, the first sidewall and the second sidewall comprising a first material, disposed as a liner along a second material, wherein the first sidewall and the second sidewall define a reentrant profile; and
directing first ions to the first sidewall along at least one non-zero angle with respect to a perpendicular to a substrate plane in a presence of a reactive ambient containing a reactive species,
directing second ions to the second sidewall along at least one non-zero angle with respect to the perpendicular to a substrate plane in the presence of the reactive ambient containing a reactive species,
wherein the first sidewall and the second sidewall are etched by the ions in combination with the reactive ambient, wherein a first portion of the first material is etched, and wherein at least a portion of the first material remains as the liner along the first sidewall, after the directing the ions, and
wherein a distance between an upper part of the first sidewall and a lower part of the second sidewall is increased, while a distance between a lower part of the first sidewall and a lower part of the second sidewall is not increased.

8. The method of claim 7, wherein the trench is formed in a layer, the layer comprising a first material, the layer disposed on a base, comprising a third material, wherein the trench further comprises a trench bottom, the trench bottom comprising a surface of the third material, and wherein the trench bottom is not etched during the directing the ions.

9. The method of claim 7, wherein, before the directing the ions, the trench comprises a narrowing profile along the perpendicular, and wherein, after the directing the ions the trench comprises a uniform profile along the perpendicular.

10. The method of claim 7, wherein the ions comprise a bimodal distribution of trajectories, wherein the ions simultaneously impact the first sidewall and the second sidewall.

11. A method of treating a substrate, comprising:
providing a surface feature in the substrate, wherein the surface feature includes a first side and a second side, opposite the first side and facing the first side, the first side and the second side being separated by a first distance, the first side and the second side comprising a first material, disposed as a liner along a second material, wherein the first sidewall and the second sidewall define a reentrant profile; and directing first ions to the first side along at least one non-zero angle with respect to a perpendicular to a substrate plane in a presence of a reactive ambient containing a reactive species, directing second ions to the second side along at least one non-zero angle with respect to the perpendicular to a substrate plane in the presence of the reactive ambient containing a reactive species, wherein the first side and the second side are etched by the ions in combination with the reactive ambient, wherein a first portion of the first material is etched, and wherein at least a portion of the first material remains as the liner along the first side, after the directing the ions, and wherein a distance between an upper part of the first side and the second side is increased, while a distance between a lower part of the first side and a lower part of the second side is not increased.

12. The method of claim 11, wherein the surface feature defines a trench.

13. The method of claim 11, wherein the surface feature defines a via.

* * * * *